US009626464B2

(12) United States Patent
Stevens

(10) Patent No.: US 9,626,464 B2
(45) Date of Patent: Apr. 18, 2017

(54) METHOD FOR EVALUATING AND CONFIGURING LABEL APPLICATION PROCESSES

(71) Applicant: The Procter & Gamble Company, Cincinnati, OH (US)

(72) Inventor: John Boyet Stevens, Mason, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 711 days.

(21) Appl. No.: 13/891,387

(22) Filed: May 10, 2013

(65) Prior Publication Data

US 2014/0336997 A1 Nov. 13, 2014

(51) Int. Cl.
*G06F 17/50* (2006.01)

(52) U.S. Cl.
CPC ...... *G06F 17/5009* (2013.01); *G06F 17/5018* (2013.01); *G06F 17/5086* (2013.01)

(58) Field of Classification Search
CPC ............ G06F 17/5009; G06F 17/5018; G06F 17/5086
USPC .................................... 703/1, 2, 6
See application file for complete search history.

(56) References Cited

U.S. PATENT DOCUMENTS

| 7,366,643 | B2* | 4/2008 | Verdura | 703/1 |
| 8,795,579 | B2* | 8/2014 | Poo | 264/534 |
| 2006/0011307 | A1* | 1/2006 | Madidini | 156/567 |
| 2006/0241791 | A1* | 10/2006 | Pokorny | G05B 17/02 700/67 |
| 2011/0214820 | A1* | 9/2011 | Sato | B65C 9/0006 156/764 |
| 2014/0183202 | A1* | 7/2014 | Hanan | B65D 1/0284 220/669 |

OTHER PUBLICATIONS

CADFEM (CADFEM eNewsletter, May 2009 (9 pages)).*
Brandau (Bottle, Performs and Closures "A design guide for PET Packaging", 2012 (185 pages)).*
International Search Report and written opinion, dated Oct. 1, 2014, 10 pages.
Bharat Chittepu: "Deformation Behavior Analysis of PET bottles in a High Speed Labeller", Infoplaner, Jan. 2009, pp. 24-25, XP055142056, internet: http://www.cadfem.in/fileadmin/consulting/DYNA.01.Pet.Bottle.PDF.
"Labeling Solutions—Sidel", Feb. 2012, pp. 1-28, XP055143027, internet: http://www.sidel.com/media/752523/labeling_gb_2012_lowres.pdf.
Jacques et al., "Buckling and wrinkling during strip conveying in processing lines", Journal of Materials Processing Technology, Elsevier, NL, vol. 190, No. 1-3, May 11, 2007, pp. 33-40, XP022070968, ISSN: 0924-0136, DOI: 10.1016/J.JMATPROTEC.2007.03.117.

* cited by examiner

*Primary Examiner* — Kamini S Shah
*Assistant Examiner* — Andre Pierre Louis
(74) *Attorney, Agent, or Firm* — David K Mattheis

(57) ABSTRACT

A method for configuring a package labeler, and or labeling process including: providing a package defined as a computed mesh; providing a computed mesh description of a package labeler; providing operational parameters of a labeling operation for the package; simulating the interaction of the package and the package labeler according to the operational parameters of the labeling operation, the computed mesh of the package labeler and the computed mesh of the package; determining the location and/or deformation of the package mesh during at least a portion of the simulated interaction; and confirming, rejecting, or configuring the package labeler according to the determined location(s).

11 Claims, No Drawings

METHOD FOR EVALUATING AND CONFIGURING LABEL APPLICATION PROCESSES

FIELD OF THE INVENTION

The invention relates to the field of label application equipment and labeling processes. The invention relates particularly to the field of evaluating and/or configuring processes of applying labels to consumer products and packaging, where these processes include combinations of labeling equipment, consumer products and packaging, and labels.

BACKGROUND OF THE INVENTION

Consumer products and consumer product packages comprising applied labels are well known in the packaging arts. Labels comprising a pressure sensitive adhesive are applied to substrates or to packages to convey information about the product for marketing and regulatory purposes. As packages become more sophisticated in terms of the shapes of the surfaces to which labels are to be applied, it is increasingly difficult to determine if a particular label may successfully be applied to a particular package. Success in label application refers to adhesion of the label to the package without an unacceptable incidence rate of label wrinkles or other visual defects in the applied labels.

Ideally label application may be evaluated prior to the fabrication of actual packages, or actual labels to avoid the costs associated with package molds etc for the purposes of evaluating label application success.

What is needed is a way to evaluate the packages, labels and label application equipment to determine if label application success is possible, and also to provide information regarding the configuration of the label, product, package, and label application apparatus to increase the likelihood of label applications success and to reduce the time spent configuring these items.

SUMMARY OF THE INVENTION

In one aspect, a method for configuring a package labeler comprises: providing a package defined as a computed mesh; providing a geometric description of a package labeler and an associated computed mesh; providing operational parameters of a labeling operation for the package; simulating the interaction of the package and the package labeler according to the operational parameters of the labeling operation, the computed mesh of the package labeler and the computed mesh of the package; determining the location and/or deformation of the package mesh during at least a portion of the simulated interaction; and configuring the package labeler according to the determined location(s).

In one aspect, a method for configuring a package, the method comprises: providing a package defined as a computed mesh; providing a geometric description of a package labeler and an associated computed mesh; providing operational parameters of a labeling operation for the package; simulating the interaction of the package and the package labeler according to the operational parameters of the labeling operation, the computed mesh of the package labeler and the computed mesh of the package and determining the location and/or deformation of the package mesh during at least a portion of the simulated interaction; configuring the package according to the determined location(s).

In one aspect, a method for configuring a label, the method comprises: providing a package defined as a computed mesh; providing a label defined as a computed mesh; providing a geometric description of a package labeler and a computed mesh; providing operational parameters of a labeling operation for the package; simulating the interaction of the package, the label and the package labeler according to the operational parameters of the labeling operation, the computed mesh of the package labeler, the computed mesh of the package and the computed mesh of the label; determining the location and/or deformation of the label and/or package mesh during at least a portion of the simulated interaction; and configuring the label according to the determined location(s).

DETAILED DESCRIPTION OF THE INVENTION

Definitions

As used herein, package and packaging materials refer to the primary, secondary, tertiary and other levels of packaging materials used in the consumer products industries. Packaging materials include, paper, cardboard, corrugate, thermoplastics including PET, PP, HDPE, LDPE, glass, wood, and metal. Composite materials comprising disparate constituent elements are also included. The packaging materials may be used to construct a primary package container such as a bottle, can, box, or bag. The packaging materials may also be used to construct secondary packaging materials such as overwraps, boxes, clamshell packages, and shipping cartons.

As used herein label refers to a packaging element applied to a package or product for the purpose of conveying visual or textual information. The label may be comprised of paper, metal or polymeric film. The label may have a homogenous structure, or a composite structure including combinations of materials. The label may be affixed to the package or product via a pressure sensitive adhesive (PSA), or by application of an adhesive or cohesive, or moisture-activated adhesive. The label may be heated and applied to the package via adhesion associated with the heating of the label. The label may include one or more embossed portions. The simulation method may be utilized to evaluate the impact of the label application process upon the embossed labels and the extent to which the label retains its embossed character after being applied to a package.

As used herein, a labeler is a machine consisting of bottle handling components, labeling handling components and some collection of wiping mechanisms to apply the label to the bottle.

The bottle handling components could include conveying chains, top stabilizer traction belts, bottle centering devices, and individual bottle plates with or without puck geometry to constrain the base of the bottle, optionally equipped with high coefficient of friction surfaces to help stabilize the bottle during label application.

The bottle handling components could impart linear, rotary or other dynamic trajectory to the bottle as it passes through the label application components. In the case of a rotary trajectory, the bottle handling components could impart a global rotation of each bottle station around a turret containing many bottle stations and/or local rotation of the bottle around the axis of the individual bottle station to aid in effectiveness of label application. The top of the bottle could be stabilized with a spring-loaded conveyor belt in the case of linear labelers or a spring loaded jack in the case of rotary labelers. In one embodiment, such spring loaded conveyor belt may be simplified for the purposes of the simulation and represented as a constant top load upon the packages. For processes during which empty bottles are labeled while pressurized, the spring loaded jack typically has a bell-shaped or plug-shaped end in order to interface with the bottle finish to create a seal during pressurization.

PSA (pressure sensitive adhesive) labels periodically adhered to a liner web are typically conveyed by some web handling system consisting of nip rollers, dancers and sheaves to manage the trajectory of the liner/label composite web into the Labeling Beak.

The labeling beak is typically a substantially planar plate geometry, typically machined from metal, that the label/liner composite web is passed over in order to strip the label from the liner and deliver it into the wiping mechanism. The liner is typically turned nearly 180 degrees over the end of the beak under tension which incites debonding of the label from the liner.

The wiping mechanisms perform the function of smoothly pressing the PSA label onto the bottle surface and can have several different geometric and material forms including fixed planar blades, spring-loaded articulating planar blades, rollers, stretched membranes, leaf springs and thick pads. Wiping mechanisms are typically made from combinations of metal, elastomeric, foam and plastic materials. The portions of the wiping mechanisms touching the label and bottle components are often coated with PTFE, or include a thin sheet of PTFE or other plastic material with low coefficient of friction. The first wipe encountered by the label is termed the primary wipe and is typically fed the label from the beak and manages the first contact between at least part of the label with the bottle. Subsequent wiping mechanisms may be included to complete the label application and/or further press the label onto the bottle to improve adhesion or remove defects.

As used herein, configuring, as applied to a package labeler, a package, or a label, means defining at least a portion of the component material properties, shapes, dimensions, material thicknesses, labeler operational parameters (set forth below), utilizing information from one or more simulation methods.

Methods for modeling the interaction of packaging containers and package labeling system elements are described herein. The terms package and container as well as the combination packaging container are all intended to embody discrete items used for the purpose of providing marketable portions of consumer products. The terms further include both actual items such as boxes, bottles and cans which have been produced in a tangible form as well as virtual simulations or models of such items produced as meshes or as parameterized definitions for input to Finite Element Analysis (FEA) software. The term design is intended to encompass all tangible and virtual forms relating to a particular envisioned form of package or package handling element.

In one embodiment, the method begins with a simulated (or modeled) package design associated with an actual package. The package may comprise an injection molded, extrusion blow molded, injection-, injection stretch- or other blow molded, thermoformed or otherwise constructed polymer container, a pouch or sachet constructed of polymer film layers, a blown glass container or an extruded and drawn metal container as well as composite containers, cardboard, products wrapped in thin polymer film or paper products. The modeled design may incorporate a model of the intended package contents and/or a package closure, spout, or other package component. The provided modeled design may originate from a computer aided engineering program or other computer based design program, or may be acquired by analyzing an actual package. The analysis may be performed upon actual packages existing as production packages or as package prototypes to provide an measured description of the physical structure of the package elements including geometric form and material thickness distribution where applicable. Models sensitive to wall thickness variations benefit from the additional accuracy provided by such data. The wall thickness profile of the package may thus be determined from an actual package or may be virtually determined from a simulation of the manufacturing process proposed for fabricating the packages or a thickness profile specification in combination with a nominal description derived from the package design, may be used as the basis for the FE representation used to describe the package. Example techniques for measuring package handling system component geometry, or package geometry and/or thickness profile include, but are not limited to: white light scanning, magnetic devices such as the Magna mike from Panametrics, dial caliper, micrometer, Micro CT, optical measurement devices, and digitizing scribe devices.

Empty Bottles/Cans/Canisters/Tubs—

Empty bottles/cans/canisters/tubs may be simulated using shell elements to represent the thin-walled structure of the bottle/can/canister/tub.

Filled (One or More Fluids) Bottles/Cans/Canisters/Tubs—

The filled package may be modeled as either open or closed/sealed. The structure of the bottle/can/canister/tub may be represented with shell elements. The fluid in the bottle/can/canister/tub may simply be represented by any combination of lumped masses, springs, dampers, rigid links, and hydrostatic loads. Alternatively, the fluid may actually be modeled, e.g. using a finite element codes' ALE formulation or other method, or a coupled finite element/fluids formulation using two independent codes working against the same model (e.g. ABAQUS/Fluent).

Filled (Powder/Solid) Bottles/Cans/Canisters/Tubs—

The filled package may be modeled as either open or closed/sealed. The structure of the package may be represented with shell elements. The solids in the package may simply be represented by any combination of lumped masses, springs, dampers, rigid links, and internal pressures. Alternatively, the solids may be modeled using either spherical particles, or continuum element formulations.

Soft, Highly Deformable Packages (e.g. Paper Towels, Tissue Paper), Covered by Thin Polymer Sheets—

In one embodiment a relatively linear response may be assumed, meaning deformation modes of cardboard cores are not considered. A simple viscoelastic model that captures the bulk response of the polymer cover and soft product material may be used. In one embodiment, the core may be included if the core materials are properly characterized.

Soft Package Filled with Fluid (e.g. Stand-Up Pouches)—

The structure of the package may be represented by shells with minimal bending stiffness, or membrane elements. The fluid in the package may simply be represented by any combination of lumped masses, springs, dampers, rigid links, and hydrostatic loads. Alternatively, the fluid may actually be modeled, e.g. using finite element codes ALE formulation.

Soft Package Filled with Powder/Solid (e.g. Stand-Up Pouches)—

The structure of the package may be represented by shells with minimal bending stiffness, or membrane elements. The solids in the package may be simply represented by any combination of lumped masses, springs, dampers, rigid links, and internal pressures. Alternatively, the solids may be modeled using either spherical particles, or continuum element formulations.

Cartons Containing Powder/Solid (e.g. Laundry or Dish Detergent)—

The structure of the carton may be represented with shell elements. The solids in the bottle may simply be represented by any combination of lumped masses, springs, dampers, rigid links, and internal pressures. Alternatively, the solids may be modeled using either spherical particles, or continuum element formulations.

Cartons Containing any Product and/or Package—

The structure of the carton may be represented with shell elements. If the carton contains a package or packages, the package can be represented by the methods described above for various package types. If the case contains a rigid product or products [e.g. molded product(s)], the product can be represented as a rigid shape with appropriate mass/inertia properties.

Corrugate Shipping Cases Containing any Product and/or Package—

The structure of the corrugate can be represented on a layer-by-layer basis, or via bulk properties that smear of the individual layers (outer sheets and inner flutes). If the case contains a package or packages, the package can be represented by the methods described above for various package types. If the case contains a rigid product or products [e.g. molded product(s)], the product can be represented as a rigid shape with appropriate mass/inertia properties.

ALE, Arbitrary Lagrangian, Eulerian, refers to a modeling method wherein the analysis proceeds with a Lagrangian deformation step followed by mapping the resulting solution onto the original undeformed Eulerian mesh.

For perspective, in analyses conducted in a Lagrangian frame of reference, a material point in the media is attached to and deforms with the mesh representing the media. Conversely, in analyses conducted in an Eulerian frame of reference, a material point in the media is detached from and displaces through the mesh which is fixed in space. Analyses using the ALE method proceed using both Lagrangian and Eulerian frames of reference sequentially.

The simulations of the method may be performed using either implicit, explicit, or a hybrid implicit/explicit analysis. As used herein, explicit refers to an unconditionally numerically stable method provided the time step remains below a critical value associated with the time it takes a sound wave to pass through a single element. The sound wave speed is governed by the stiffness and density of the media. Explicit requires calculation of the effective stiffness matrix of the system only once at the beginning of the analysis. Explicit typically requires a very small time increment that remains constant throughout the analysis unless there is severe deformation. Using very small elements may cause the stable time increment to be very small and will dramatically reduce computational efficiency. Explicit may generally be used for short term dynamic or quasi-static events (up to 5 seconds event time) and may not be not favorable for analyses that require static equilibrium. Explicit may be generally favored for analyses with a lot of contact due to computational efficiency.

As used herein, implicit refers to analysis which may be conditionally numerically stable. Such analysis can be difficult to converge. Implicit requires calculation of the effective stiffness matrix at every increment. Each time step is more computationally expensive than the equivalent explicit analysis step but often bigger time steps may be taken than in an explicit analysis. Implicit requires a more skilled user to ensure analysis convergence particularly for dynamic analyses. In implicit analysis the time step varies over the course of the analysis and has no dependence on element size. Implicit analysis may generally be used for analyses wherein static equilibrium is to be enforced, but may also be used for dynamic analyses (short event time), quasi-static analyses (time independent) and creep/viscoelastic analyses (long or short event time).

An implicit/explicit hybrid means any method that uses both explicit and implicit either sequentially or in parallel and for any part or whole of the domain of the model. For example the entire model may run n explicit time steps followed by n implicit time steps repeating over and over. As another example part of the model may always run in implicit while another part of the model may always run in explicit.

The properties of the package materials may be derived according to the nominal values associated with the intended materials or may be provided by evaluation of actual materials taken from fabricated packages. The viscoelastic properties of polymer materials may be evaluated and provided as model inputs. Additionally, model-to-physical experiment comparison of package impact loads, rebound velocity, impulse, impact event duration, and deformation responses may be used to calibrate and/or validate model parameters such as the viscoelastic, material model, contact parameters, damping parameters, coefficient of friction (COF) models, or other parameters in the FEA analysis.

The methods of the invention may be provided as coded instructions for use with a computer. The instructions may be provided as stored information on a hard drive of a computer or stored upon computer readable media such as removable disks or solid-state memory.

In one embodiment, a Graphical User Interface (GUI) provides a means for a user to interact with and utilize the method of the invention.

The methods of the invention may be practiced on appropriately configured computational platforms. The platforms supported include personal computers and large-scale personal computer-based scientific computing clusters.

As part of the method, a computed mesh description of a package is provided as described above. The computed mesh defines the outer surface of the package. The computed mesh may further define the inner surface of the package.

Similarly, a computed mesh description of the label is provided and a computed mesh description of the package labeler setting forth at least a relationship of the respective package and label contact portions of the labeler sufficient to enable the boundary conditions of the interaction of the labeler and the package, as well as the labeler-package-label interactions to be established.

The operational parameters of the package labeler, including: package overall dimensions (x, y and z bounding box); package condition during labeling—filled/capped, empty or empty and pressurized; fill height (if filled); package material (HDPE, PET, etc.); product material (fluid, powder, etc.); product density; line speed; package pitch, package topload applied by the labeler; the beak configuration including: beak angle (x, y and z) and beak position (x, y and z); the wipe design including: dimensions/geometry of wipe (could be a 3 step blade, as well as mechanisms included in the wipe design (articulating, roller, spring-loaded, dashpot etc.), and wipe materials (foam, rubber, spring steel plate etc.); the wipe configuration including: position of wipe (x, y and z), wipe angle (x, y and z); the label geometry; label height, width and thickness; the label shape; the label dispensing parameters including: label pre-dispense distance, label acceleration/deceleration, label peak velocity, label speed match ratio (the ratio of the speed of the label to the speed of the package, calculated using the machine direction speeds of the label and package during the label application process), the label vertical positioning with respect to the bottom of the beak, and the label material properties (density, modulus, orthotropy, etc).

The method utilizes the provided component meshes, and operational parameters in simulating at least the interaction of the package and the package labeler according to the operational parameters of the labeling operation, the computed mesh of the package labeler and the computed mesh of the package. The method may further consider the interaction of the package, labeler and label by including the computed mesh description of the label in the simulation calculations. In one embodiment, the label is simulated as moving along a support surface at a particular velocity held in place by a force calculated to simulate the adhesion of the label to the liner. In this embodiment, the simulated geometry of the label path with respect to the beak is inverted from the reality of the labeling apparatus. Although the actual label and liner pass along the beak surface furthest from the target package, the simulated label passes along the beak surface closest to the package and transitions from that surface to the surface of the wiper.

In one embodiment, the simulation calculates the position of the package mesh and label mesh as each progresses through the labeler geometry. The interaction of the two meshes may also be calculated.

The simulation may also be used to evaluate the interaction of the package and the package labeler, with or without regard to the interaction of the label. In one embodiment, the package-labeler interaction may be simulated to determine if the interaction yields an acceptable contact pressure or contact area or wipe down of the package by the wiper of the labeler. An unacceptable result may be used as an indicator of a need to alter the package and/or at least a portion of the labeler.

After at least one iteration of simulated label package interaction, the results of the simulation may be reviewed to determine if the interaction of the label, package and labeler has yielded an acceptable label application in terms of placement of the label, deformation of the label and package during the application of the label, and any residual stresses in the label or package which may indicate wrinkles in the label or a tendency for the label to wrinkle or otherwise deform in an unacceptable manner over time.

Exemplary label defects, indicative of an unacceptable label application include: bubbles, unattached portions of a label completely surrounded by attached label portions, darts, unattached portions of a label extending to one edge of the label, and wrinkles, unattached portions of a label extending from one edge of the label to another edge of the label. The results of an acceptable iteration may be used to confirm a provided set of parameters and specifications for use, or create a set of labeler specifications associated with the particular simulated package and label to assist in setting the geometry of a labeler to apply the specified label to the particular package. If the results of an iteration indicate that the application of the label will have an unacceptable result, the results may be used to reject particular labeler settings, labeler geometry, label geometry, and/or bottle geometry.

The simulation provides the calculated stresses and/or strains of the label, package and labeler components during and after the interaction of the label, package and labeler.

The simulation may use the calculation of the interactions of the geometric meshes to determine a contact pressure between the portions of the label and the corresponding portions of the package during the label application process. A contact pressure of zero during the label application process may indicate an unacceptable label application.

The simulation may calculate a principle strain upon a midplane, or other defined surface, of the label. The midplane is any predefined sectional surface of the label between the outer label surface and the package contacting surface. The calculated principle strain may be used as an indicator of the residual strain upon any portion of the label and as an indirect indicator of the likelihood that the label will creep or otherwise deform over time after completion of the label application. A residual compressive strain may provide an indication of an unacceptable label application process. Similarly, the tensile stresses to which the label is subjected during the label application may be calculated and provided as part of the simulation output.

The simulation may be used to examine the suitability of a particular package design in terms of the ease and/or reliability with which a particular labeler may apply a particular label. The design of the package may be reviewed and simulated across a range of one or more dimensions or other characteristics of the package, including the wall thickness and material distribution in the package, in order to determine an optimal package design from the perspective of label application.

Similarly, the simulation may be used to determine the acceptability of a particular label design and/or material with respect to a particular package and/or labeler design to determine an optimal label material, design, etc.

The simulation maps the locations of the label and package over the time of the label application process. The simulation outputs include a determination of any location across the area of the label where there is no contact with the package—indicative of a wrinkle, dart, bubble, or other defect in the applied label.

The simulation may be used to map the application of an embossed label to determine the impact the labeling process has upon the embossments of the label, and the extent to which the embossments remain after the application of the label.

The contact history between the label and package as well as the deformation history of each of the package and label are also outputs of the simulation and enable further analysis of the package, label and labeler configuration over the time spanned by the label application process.

In one embodiment, the simulation presumes perfect adhesion between the label and the package at every point where there is contact between the label and the package. Prophetically, the simulation scope may be expanded to include the simulation of the adhesion between the label and package. Label to bottle adhesion may be phenomenologically modeled using the cohesive surface behavior in ABAQUS, available from Dassault Systemes in Paris, France, or by defining a user defined interaction (VUINTER) user subroutine.

The cohesive surface behavior capability in ABAQUS allows definition of a traction-separation type of elasticity between two contacting surfaces that is enabled upon contact. This relationship can be linear or non-linear and can be modified by both damage initiation and damage evolution criterion. The damage initiation criterion is a traction or displacement based condition upon which the cohesive elasticity between the label and the bottle starts to degrade. The damage evolution governs the change in traction-separation degradation after damage is initiated. The parameters to govern the cohesive surface behavior model for a given pair of label substrate/adhesive and bottle material could be determined from a combination of peel tests and contact adhesion tests.

An exemplary system for implementing the blocks of the claimed method includes a general purpose computing device in the form of a computer. Components of the computer may include, but are not limited to, a processing unit, a system memory, and a system bus that couples various system components including the system memory to the processing unit.

The computer may operate in a networked environment using logical connections to one or more remote computers, such as a remote computer, via a local area network (LAN) and/or a wide area network (WAN) via a modem or other network interface.

Computer typically includes a variety of computer readable media that may be any available media that may be accessed by computer and includes both volatile and nonvolatile media, removable and non-removable media. The system memory includes computer storage media in the form of volatile and/or nonvolatile memory such as read only memory (ROM) and random access memory (RAM). The ROM may include a basic input/output system (BIOS). RAM typically contains data and/or program modules that include operating system, application programs, other program modules, and program data. The computer may also include other physical removable/non-removable, volatile/nonvolatile computer storage media such as a hard disk drive a magnetic disk drive that reads from or writes to a magnetic disk, and an optical disk drive that reads from or writes to an optical disk, or solid state memory elements. The hard disk drive may interface with system bus via interfaces. Communication media, separate from the computer readable media and computer storage media described above, may include data signals and propagated media such as carrier waves.

A user may enter commands and information into the computer through input devices such as a keyboard and pointing device, commonly referred to as a mouse, trackball or touch pad. Other input devices (not illustrated) may include a microphone, joystick, game pad, satellite dish, scanner, or the like. These and other input devices are often connected to the processing unit through a user input interface that is coupled to the system bus, but may be connected by other interface and bus structures, such as a parallel port, game port or a universal serial bus (USB). A monitor or other type of display device may also be connected to the system bus via an interface, such as a video interface. In addition to the monitor, computers may also include other peripheral output devices such as speakers and printer, which may be connected through an output peripheral interface.

A graphical user interface (GUI) may be created to facilitate the simulations by a user of the method. The GUI may include one or more menus comprising options associated with defining the package, labeler, and/or label, as well as the operational parameters of the labeler.

Packages, labels, and labeler configurations may also be selected from ranges of predefined software scripts for each of these items, again diminishing the level of expertise necessary to utilize the modeling method.

The use of predefined scripts enables the specification of package labelers which reflect actual systems rather than limiting the model to a single predefined labeler configuration. This enables the user to specify the range of interactions between the packages, labels and the package labeler more realistically. The user may specify the operational parameter inputs and initial conditions of the system as ranges thereby enabling a more complete model of possible scenarios and outcomes.

The output of the simulations may be presented graphically as a single image, or as a time dependent series of images presented as an animation of the interaction of the package and labeler, or package, label and labeler. The output may be presented showing a side view of the package in translation through the label application step. The output may be presented as a plan view of a cross-section of the package at a location of interest in the interaction of label, package, labeler etc. The output may be limited to a confirmation or rejection of the inputs as viable in view of defined constraints.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for configuring a package labeler, the method comprising steps of:
    a) providing a package defined as a computed mesh;
    b) providing a computed mesh description of a package labeler;
    c) providing operational parameters of a labeling operation for the package utilizing the package labeler;
    d) simulating the interaction of the package, and the package labeler according to the operational parameters of the labeling operation, the computed mesh of the package labeler, and the computed mesh of the package;
    e) determining the location of the package mesh during at least a portion of the simulated interaction; and
    f) confirming, rejecting, or configuring the package labeler according to the determined location(s).

2. The method according to claim 1 further comprising the step of determining the stresses and/or strains incurred by the package.

3. The method according to claim 1 further comprising the step of determining the stresses and/or strains incurred by the package labeler.

4. A method for configuring a package, the method comprising steps of:

a) providing a package defined as a computed mesh;
b) providing a computed mesh description of a package labeler;
c) providing operational parameters of a labeling operation for the package utilizing the package labeler;
d) simulating the interaction of the package, the label and the package labeler according to the operational parameters of the labeling operation, the computed mesh of the package labeler and the computed mesh of the package;
e) determining the location and/or deformed shape of the package mesh during at least a portion of the simulated interaction; and
f) confirming, rejecting, or configuring the package according to the determined location(s) and/or deformation(s).

5. The method according to claim 4 further comprising the step of determining the stresses and/or strains incurred by the package.

6. The method according to claim 4 further comprising the step of determining the stresses and/or strains incurred by the package labeler.

7. A method for configuring a label, the method comprising steps of:
a) providing a package defined as a computed mesh;
b) providing a label defined as a computed mesh;
c) providing a computed mesh description of a package labeler;
d) providing operational parameters of a labeling operation for the package utilizing the package labeler;
e) simulating the interaction of the package, the label and the package labeler according to the operational parameters of the labeling operation, the computed mesh of the package labeler and the computed mesh of the package;
f) determining the location and/or deformed shape of the label and/or package mesh during at least a portion of the simulated interaction; and
g) confirming, rejecting, or configuring the label according to the determined location(s) or deformations.

8. The method according to claim 7 further comprising the step of determining the stresses and/or strains incurred by the package.

9. The method according to claim 7 further comprising the step of determining the stresses and/or strains incurred by the label.

10. The method according to claim 7 further comprising the step of determining a contact pressure between the label and the package.

11. The method according to claim 7 further comprising the step of determining the minimum principle strain incurred at the midplane of the label.

* * * * *